US012183847B2

(12) United States Patent
Song (10) Patent No.: US 12,183,847 B2
(45) Date of Patent: Dec. 31, 2024

(54) METHOD FOR MANUFACTURING SUPPORTING SUBSTRATE FOR SEMICONDUCTOR LIGHT-EMITTING DEVICE

(71) Applicant: WAVELORD CO., LTD, Gyeonggi-do (KR)

(72) Inventor: June O Song, Gyeonggi-do (KR)

(73) Assignee: WAVELORD CO., LTD, Gyeonggi-do (KR)

( * ) Notice: Subject to any disclaimer, the term of this patent is extended or adjusted under 35 U.S.C. 154(b) by 415 days.

(21) Appl. No.: 17/621,402

(22) PCT Filed: Jun. 24, 2020

(86) PCT No.: PCT/KR2020/008226
§ 371 (c)(1),
(2) Date: Dec. 21, 2021

(87) PCT Pub. No.: WO2020/262957
PCT Pub. Date: Dec. 30, 2020

(65) Prior Publication Data
US 2022/0359784 A1    Nov. 10, 2022

(30) Foreign Application Priority Data

Jun. 24, 2019    (KR) .................. 10-2019-0075035

(51) Int. Cl.
*H01L 33/00*    (2010.01)
(52) U.S. Cl.
CPC .. *H01L 33/0093* (2020.05); *H01L 2933/0066* (2013.01)

(58) Field of Classification Search
None
See application file for complete search history.

(56) References Cited

U.S. PATENT DOCUMENTS

| 5,691,041 | A  | * | 11/1997 | Frankeny | ............... | H01R 12/52 |
| | | | | | | 428/209 |
| 6,213,386 | B1 | | 4/2001 | Inoue et al. | | |
| 7,745,912 | B2 | * | 6/2010 | Sir | ......................... | H05K 3/303 |
| | | | | | | 257/668 |
| 7,772,036 | B2 | | 8/2010 | Bauer et al. | | |
| 8,907,489 | B2 | | 12/2014 | Kunimoto et al. | | |

(Continued)

FOREIGN PATENT DOCUMENTS

| JP | 2009-532912 A | 9/2009 |
| JP | 2013-062474 A | 4/2013 |

(Continued)

OTHER PUBLICATIONS

International Search Report from corresponding PCT Application No. PCT/KR2020/008226, dated Oct. 12, 2020.

*Primary Examiner* — Robert K Carpenter
(74) *Attorney, Agent, or Firm* — Harness, Dickey & Pierce, P.L.C.

(57) ABSTRACT

Disclosed is a method for manufacturing a supporting substrate for a semiconductor light emitting device, the method including: preparing a substrate having a groove; introducing a material into the groove of the substrate, the material serving to form a thermal and/or electrical pass; and compressing the material inwards from both ends of the groove, using a compressing means.

13 Claims, 10 Drawing Sheets

(56) References Cited

U.S. PATENT DOCUMENTS

| | | | |
|---|---|---|---|
| 9,231,328 B2* | 1/2016 | Rathburn | ............ H01R 13/2485 |
| 2011/0163433 A1 | 7/2011 | Toda et al. | |
| 2015/0380339 A1* | 12/2015 | Zhao | .................. H01L 25/0657 |
| | | | 438/109 |
| 2019/0229230 A1 | 7/2019 | An | |

FOREIGN PATENT DOCUMENTS

| | | |
|---|---|---|
| KR | 10-2011-0081813 A | 7/2011 |
| KR | 10-2017-0124766 A | 11/2017 |

* cited by examiner

METHOD FOR MANUFACTURING SUPPORTING SUBSTRATE FOR SEMICONDUCTOR LIGHT-EMITTING DEVICE

CROSS-REFERENCE TO RELATED APPLICATIONS

This application is a National Phase Application of U.S. PCT/KR2020/008226, filed on Jun. 24, 2020 which claims priority to Korean Patent Application No. 10-2019-0075035, filed on Jun. 24, 2019. The entire disclosures of the application identified in this paragraph are incorporated herein by references.

TECHNICAL FIELD

The present disclosure relates generally to a method for manufacturing a supporting substrate for a semiconductor light emitting device. In particular, it relates to a method for manufacturing a supporting substrate for a semiconductor light emitting device, capable of operating at high power, high temperature and high pressure. The term 'semiconductor light emitting device' herein should be understood in a broad sense, including, but not limited to LEDs and LDs.

BACKGROUND

This section provides background information related to the present disclosure which is not necessarily prior art.

Figure 1:
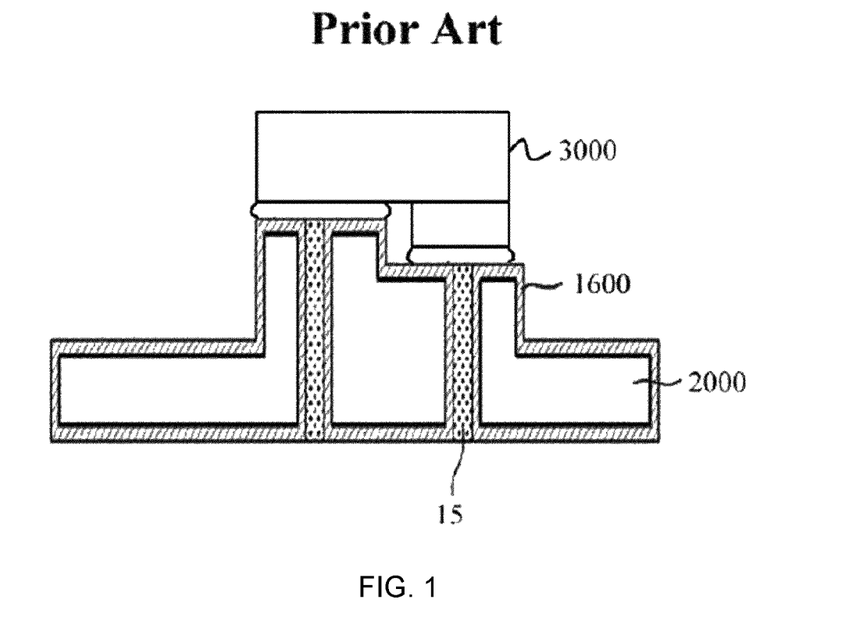
FIG. 1 shows an example of a submount or supporting substrate for a semiconductor device described in Korean Patent Registration No. 10-1432728.

FIG. 1 shows an example of a submount or supporting substrate for a semiconductor device described in Korean Patent Registration No. 10-1432728, in which the support substrate for a semiconductor device includes a silicon base 2000 coupled to a semiconductor device 300 for supporting the device, a conductive part 15 for conductivity and heat dissipation, and an insulation layer 1600 that insulates the conductive part 15 and the silicon base 2000. To keep abreast of the high-power and/or integration (downsizing) trend in the semiconductor device industry, a supporting substrate for a semiconductor device is also required to withstand a high temperature, high heat environment. However, when a semiconductor material (e.g., the silicon base 2000) is used as described in the document, parasitic capacitance may be generated between the semiconductor material and the conductive part 15 during high power (high voltage, high current) usage, causing a current leakage. To prevent this, the insulation layer 1600 is absolutely necessary. Moreover, considering that the melting point of silicon is not that high (e.g., around 1414° C.), it is not easy for the silicon base to retain stable physical properties in high temperature operations, and the base may develop cracks due to a difference in thermal expansion coefficients between the base and the conductive part 15. Further, the conductive part 15 in this example is typically obtained by electroplating. However, metals used for electroplating may expand when heated, and it is difficult to compactly pack such electroplating materials into elongated grooves 14. As a result, a defect may occur, post processes may become more complicated, and higher manufacturing costs may incur. Therefore, there is a need to overcome these disadvantages and drawbacks.

FIGS. 2-6 illustrate examples of a supporting substrate for a semiconductor device and methods of manufacturing such semiconductor device, as described in PCT Publication No. WO/2017/191943.

Figure 2:
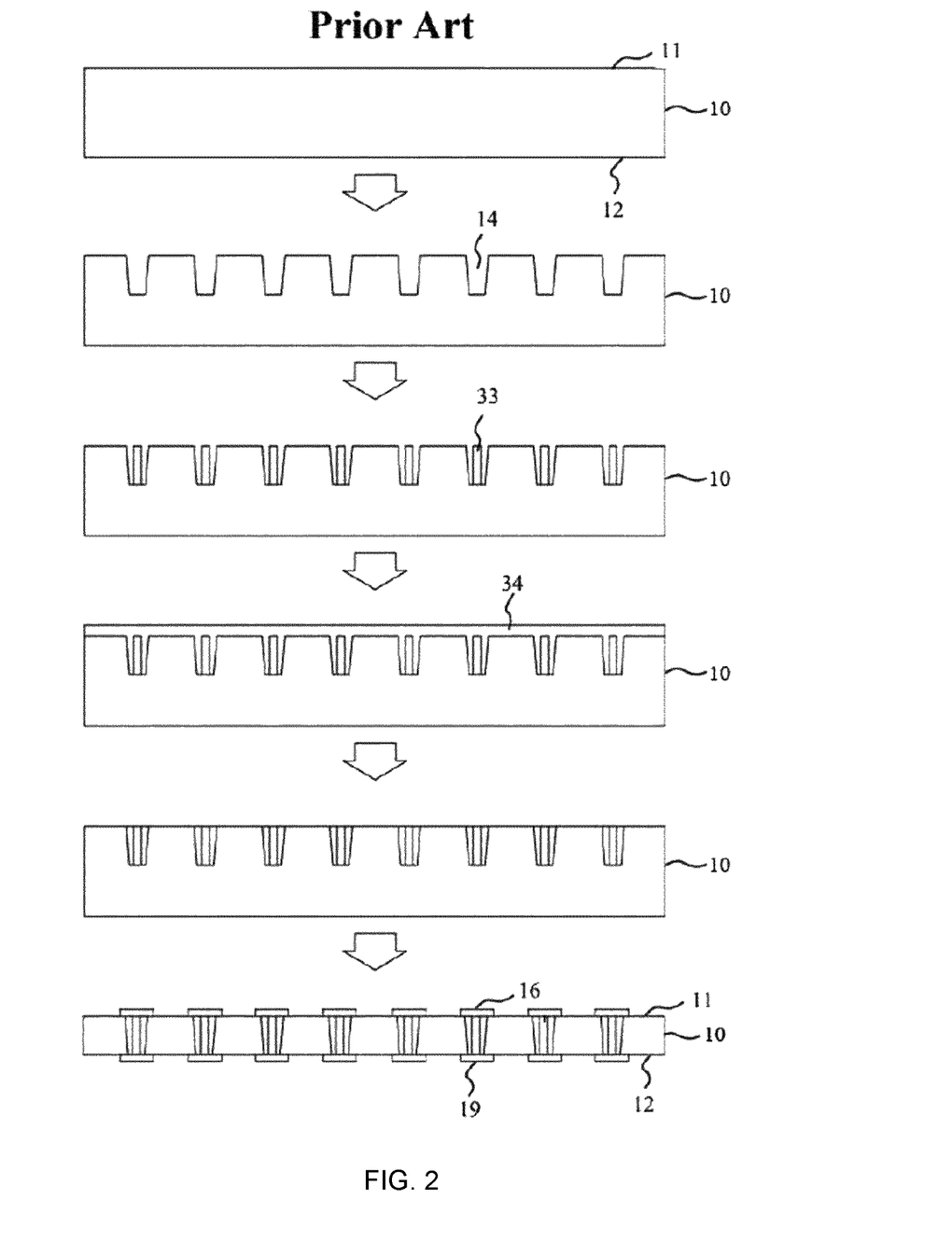
FIGS. 2, 3, 4, 5 and 6 illustrate examples of a supporting substrate for a semiconductor device and methods of manufacturing such semiconductor device, as described in PCT Publication No. WO/2017/191943.

FIG. 2 shows a first substrate 10 as the supporting substrate for a semiconductor device. The first substrate 10 includes a first plane 11, a second plane 12 opposite to the first plane 11, grooves 14 extending from the first plane 11 into the first substrate 10 and inserts 33 placed and secured into the grooves 14, respectively. Each insert 33 works as a thermal or heat-dissipating pass and/or an electrical pass. When the insert 33 works as an electrical pass, it serves the same function as the conductive part 15. The grooves 14 may be formed by laser ablation, chemical wet etching, dry etching, sand blasting, or ultrasound drilling, for example. The shape of the grooves 14 is not particularly limited, but may be formed in a circular shape, preferably with a width ranging from 500 nm to 500 µm. If the width is less than 500 nm, it will not be easy to put the insert 33 into a corresponding groove; if the width exceeds 500 µm, cracking is more likely to occur during the manufacturing process. At least one groove 14 is adequate for each semiconductor device. In particular, when a groove serves as an electrical pass, the number of grooves preferably equals to or higher than the number of electrodes present in a corresponding semiconductor light emitting device. Spacing between the grooves 14 and depth of each groove may vary depending on the type of a device to be produced on the first substrate 10, and these grooves 14 are designed to run from the first plane 11 to the second plane 12, passing through the first substrate 10.

As discussed earlier in FIG. 1, the conductive part 15 is typically obtained by electroplating, but metals used for electroplating are susceptible to thermal expansion, making it difficult to compactly pack such electroplating materials into elongated grooves 14. As a result, a defect may occur, post-processing may become more complicated, and high manufacturing costs may incur. By way of example, in case of electroplating, an electroplating material (e.g., copper) is placed at the anode (+) and a target to be plated is placed at the cathode (−). The electroplating material is then reduced at the target and the conductive part 15 is formed. This process, however, has limitations in obtaining compact conductive parts 15.

This disadvantage can be addressed by making the inserts 33 with rod or wire-shaped substances. In fact, µm-scale wires (e.g., Nickel Wire, Cobalt Wire, Iron Wire) are already commercially available (these can be easily found through Google's search). This type of wire is cut to a desired depth of a corresponding groove 14 to form a rod-shaped insert 33. As nickel, cobalt, and iron are ferromagnetic metal substances, a magnet (not shown) can be utilized. That is, the rod-shaped insert 33 prepared from those substances is positioned on the first plane 11, and a magnet moves along the second plane 12 to cause the insert 33 to be drawn into the groove 14. This magnet-assisted technique of positioning the inserts 33 in the corresponding grooves 14 is disclosed in U.S. Pat. No. 3,736,651, for example. In case of utilizing a magnet to draw the inserts 33 into the grooves 14, the inserts 33 should preferably be made of ferromagnetic substances such as Ni, Co, and Fe, or ferromagnetic alloys including any one of them. Unlike the conductive part 15 formed by electroplating, these solid, compact rod-shaped inserts 33 can provide enhanced thermal conductivity and electrical conductivity, without expanding when heated. This makes it possible to prevent cracking in a semiconductor device, as well as separation (i.e. broken bonding) between the semiconductor device and a supporting substrate. All of part of the rod-shaped insert 33 may be made of ferromagnetic substances. Additionally or optionally, the surface of the insert 33 may be coated with paramagnetic substances, such as Ag, Au or Cu.

Figure 4:
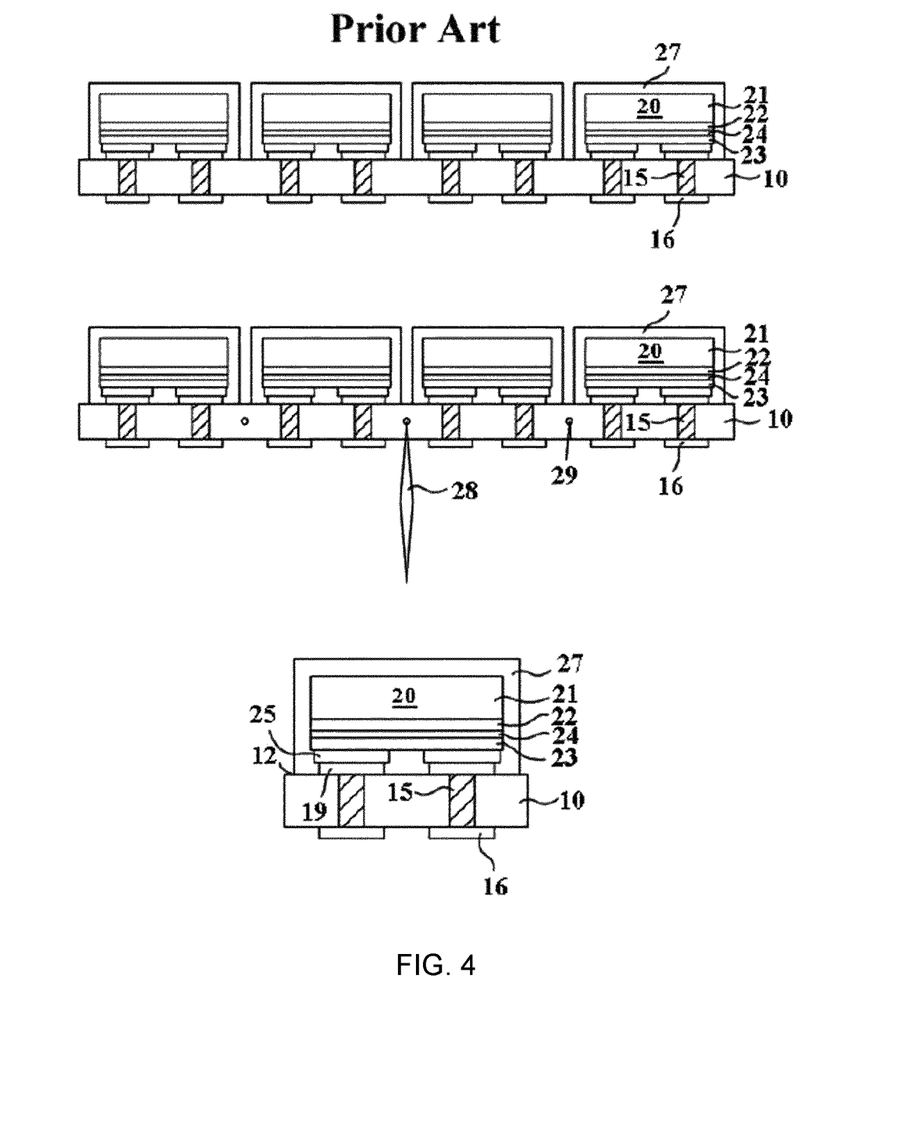
Figure 5:
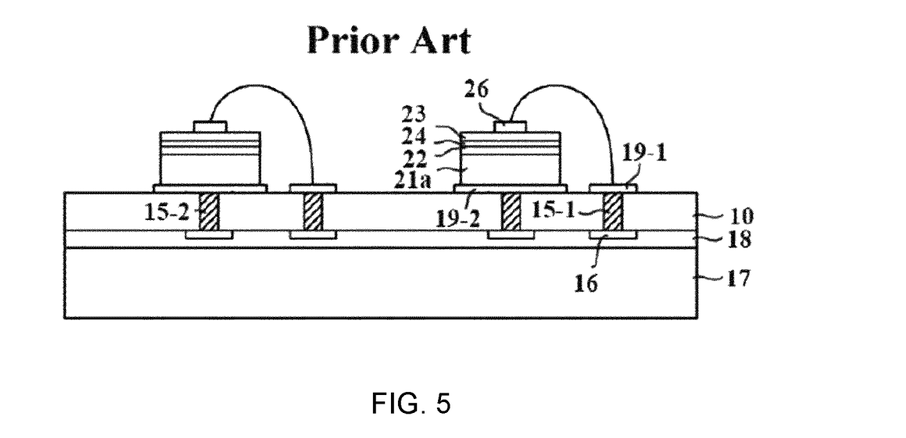

Instead of placing the solid rod-shaped inserts 33 directly into the grooves 14, it is also possible to introduce continuous liquid-phase substances into the respective grooves 14 to form inserts 33. This can be accomplished by wire bonding or a wire bonder, which is employed for electrically connecting the semiconductor device and the first substrate 10, as shown in FIGS. 4 and 5. As wire bonding or wire bonders are broadly used in the semiconductor industry, it will not be explained in further detail here. It suffices to say that wire bonding makes it possible to introduce continuous liquid-phase wire-shaped inserts 33 into compactly arranged grooves 14 at lower costs. This type of insert 33 can be made of a material suitable for wire bonding, including, but not limited to Au, Au alloys, Ag, Ag alloys, Cu, Cu alloys, Al or Al alloys, for example.

Alternatively, the inserts 33 may be formed by introducing metal powders and/or alloy powders with high reflectivity and/or high heat dissipation, ceramic powders with high heat dissipation (e.g., AlN, BN, SiC, AlSiC), or any mixture of these and an organic binder into the respective grooves 14 and carrying out heat treatment. A dispenser, which is generally used for coating an encapsulating material, can be handy to put those materials into the grooves 14. In doing so, the inserts 33 may be secured within the grooves 14 without the application of a fixation substance 34 (to be described), and post-processing such as polishing the first plane 11 may be omitted. Examples of substances with high reflectivity and high heat dissipation include metals including, but not limited to Al, Ag, Rh, Pt, Pd, Au, Cr, Ni, Mo, Ti, Cu, or any alloy containing at least one of them.

When the inserts 33 are formed independently of electroplating or PVD, the inserts 33 need to be fixed or filled within the grooves 14. The fixation substance 34 is therefore applied either before or after the inserts 33 are placed in their corresponding grooves 14. FIG. 2 shows that the fixation substance 34 is applied after the inserts 33 are positioned. The fixation substance 34 is coated (e.g., spin coated) and then undergoes drying or heat treatment, such that the inserts 33 within the grooves 14 may be secured therein. Examples of such fixation substances 34 include but are not limited to organic low-k dielectrics, such as, SOC (Spin-on-Glass), BCB (benzocyclobutene), PR (photoresist), Epoxy-based polymers, silicone, parylene, SU-8 and so on. Besides these organic low-k dielectrics, a paste containing high thermal conductivity metals, alloys or ceramic powder particles in a viscous liquid-phase substance for effective heat dissipation can also be used as the fixation substance.

Additionally or alternatively, before the inserts 33 or the fixation substance 34 such as SOG is placed in the grooves 14, a high reflectivity and/or high thermal conductivity substance 35 such as Al, Ag, Rh, DBR (distributed Bragg reflector), or ODR (omni directional reflector) can be provided into the grooves 14 and then subject to heat treatment such that the inserts 33 are secured within the grooves 14.

When a semiconductor device (power device, semiconductor optical device, etc.) is used together with the first substrate 10 in high-power, high-temperature and high-pressure environments, although depending on the material of the first substrate 10, parasitic capacitance may be generated, causing a current leakage. Moreover, the first substrate 10 may be cracked easily due to a CTE (coefficient of thermal expansion) difference between the first substrate 10 and the inserts 33. These issues can be resolved somewhat by employing the fixation substance 34 including organic low-k dielectrics, such as, SOC (Spin-on-Glass), BCB (benzocyclobutene), PR (photoresist), Epoxy-based polymers, silicone, parylene, SU-8 or the like. More desirably, however, the first substrate 10 can be made of a sintered composite of single crystalline and poly crystalline-electrical insulating oxide (e.g., $Al_2O_3$, ZnO), electrical insulating nitride (e.g., AlN, $Si_3N_4$, GaN, AlGaN) and electrical insulating carbide (e.g., SiC, AlSiC) having a high melting point of 1500° C. or higher, which can be used in high-power, high-temperature and high-pressure environments. Therefore, this electrical insulating first substrate 10 inhibits the occurrence of parasitic capacitance and current leakage, and its high melting point makes it possible to maintain stable physical properties even at high temperatures, together providing more options for materials of the inserts 33 and fixation substance 34.

Moreover, when the first substrate 10 used is single crystalline or light transmitting, a laser beam can be irradiated into the first substrate 10 to facilitate the cutting or ablation process, as illustrated in FIG. 4.

Figure 3:
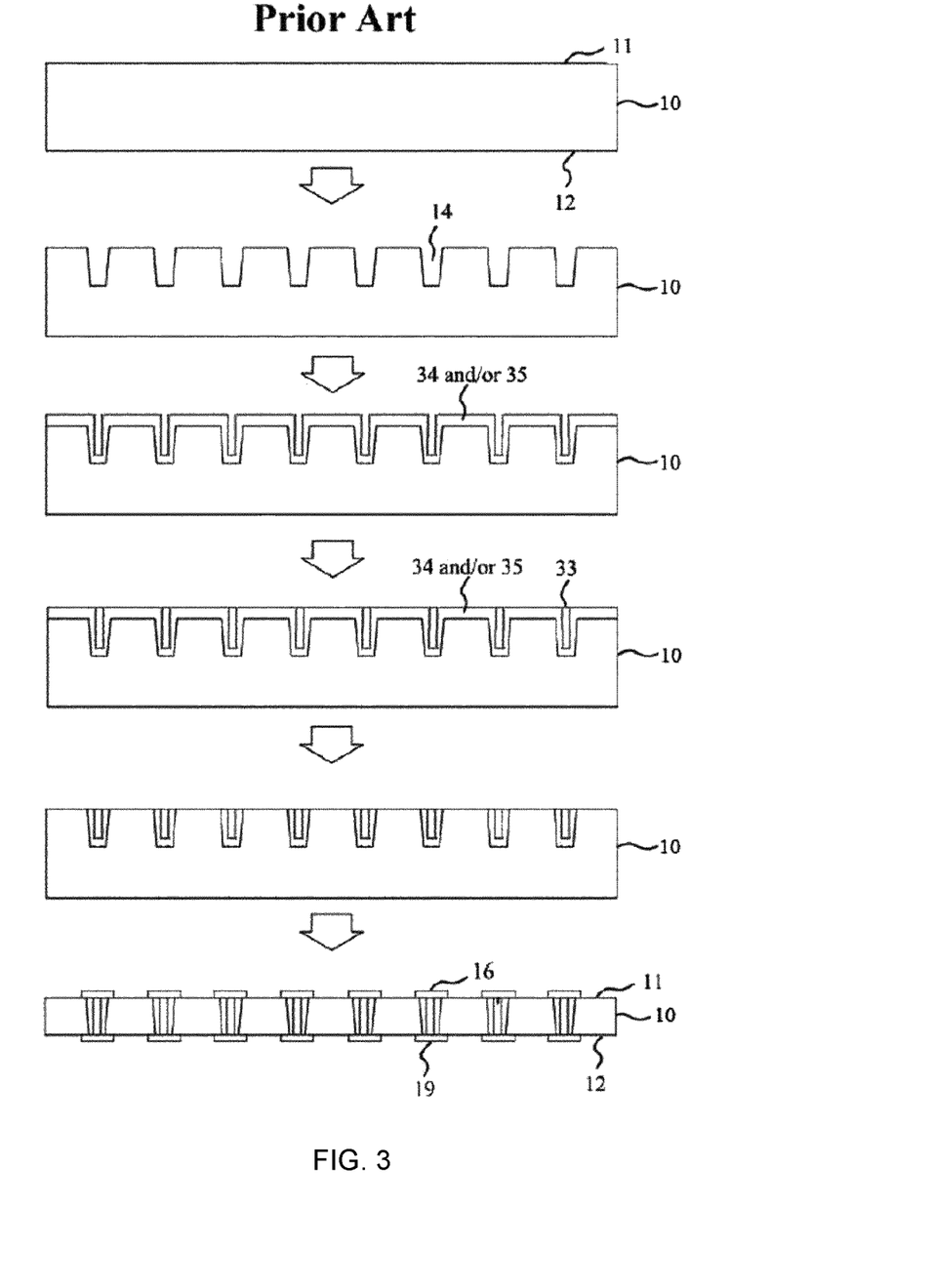

Referring now to FIG. 3, optionally, the fixation substance 34 may be applied to the grooves 14 before the inserts 33 are placed therein. This is advantageous in that the placement of the inserts 33 can be done easily as the inserts 33 are placed after rough surfaces of the grooves 14 caused by laser ablation are covered first. Once the inserts 33 are positioned, they undergo drying or heat treatment such that the inserts 33, together with the fixation substance 34, can be secured within the grooves 14. Again, the fixation substance 34 here can be made of those mentioned above. Additionally or alternatively, an adhesive metal material can be added to this fixation substance 34. In that case, wire bonding as well as secure placement of the inserts 33 can be facilitated, prior to drying or heat treatment (or without heat treatment). Optionally, the adhesive metal material may be deposited directly. In the example shown in FIG. 3, after the fixation substance 34 is applied to the grooves 14 and before the inserts 33 are placed in their corresponding grooves 14, a portion of the fixation substance 34 over the first plane 11 can be removed beforehand, while retaining the rest of the fixation substance inside the grooves 33. By doing so, the inserts 33 placed in the grooves, as well as the adhesive metal substance can be more firmly secured through the heat treatment. Likewise, when the fixation substance 34 is made of ceramic powder, it can be applied to the grooves 14 before the inserts are placed therein. The processes of depositing the adhesive metal substance and/or high reflectivity substance 35, introducing the fixation substance 34, and placing the inserts 33 may be carried out at different orders (for instance, depositing the adhesive metal substance and/or high reflectivity substance 35 can be performed first, followed by placing the inserts 33 and finally introducing the fixation substance 34).

The bonding material can be chosen from low melting point (e.g., 300° C. or lower) metals (Sn, In, Zn and Ga), and alloys or pastes containing at least one of them. The bonding material can be produced by preparing a uniform viscous mixture of a powder of fine particles (5 μm or smaller) of low melting point metal and/or high melting point metal and/or an organic binder, dispensing the mixture, and carrying out heat treatment on the mixture.

Introducing the fixation substance 34 and/or the high reflectivity substance 35 into the groove 14 beforehand allows to control the size of the grooves 14, independently of ablation or drilling, such that placing the inserts 33 of the μm scale can be done more easily with high precision. In other words, the size of the grooves 14 can be controlled in a precise manner by an operation such as spin coating, deposition, or the like, independently of ablation or drilling.

Going back to FIG. 2, after the inserts 33 and the fixation material 34 are placed and secured within the grooves 14, if needed and desirable, a portion of the first substrate 10 on the first plane 11 can be removed. As a result of the removal, the fixation substance 34 located on the first plane 11 is removed, and the inserts 33 and the corresponding grooves 14 may be on the same level. This removal can be done by polishing.

Figure 6:
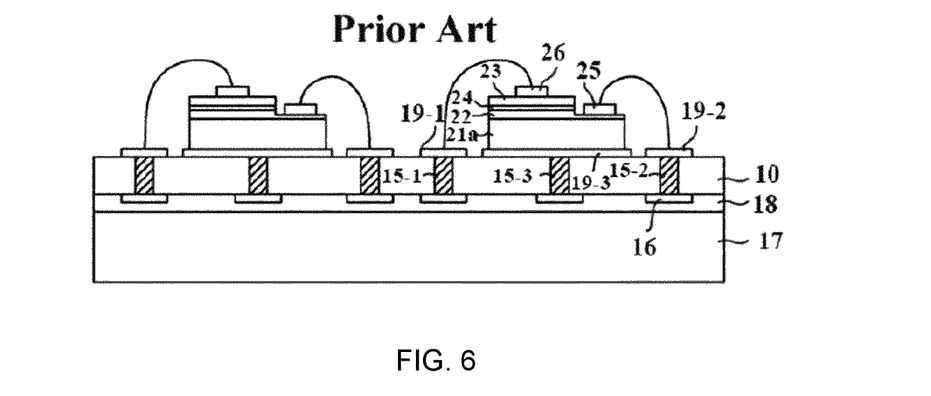

Additionally or alternatively, a pad 16 (a conductive pad if it serves as an electrical pass) can be provided to each insert 33 for a stable electrical and/or physical contact with the semiconductor device. Likewise, a pad 19 (a conductive pad if it serves as an electrical pass) can be provided on the second plane 12, through polishing. In the previous processes, the second substrate 17 may be used on the first plane 11 (optionally, the second substrate 17 may be provided on the second plane 12), as shown in FIGS. 4-6. Alternatively, when the fixation substance 34 is not available, the pad 16 and/or the pad 19 can be used for securing the inserts 33 within the grooves 14.

For a material of the supporting substrate illustrated in FIGS. 2-3, a sintered composite of single crystalline and poly crystalline-electrical insulating oxide (e.g., $Al_2O_3$, ZnO), electrical insulating nitride (e.g., AlN, $Si_3N_4$, GaN, AlGaN), electrical insulating carbide (e.g., SiC, AlSiC) having a high melting point of 1500° C. or higher, which can be used in high-power, high-temperature and high-pressure environments is particularly suitable. The material can be selected based on the composition of a substance of the semiconductor device being supported, CTE, required electrical and heat dissipation specifications, and so on. Therefore, with this type of electrical insulating substrate having a high melting point of 1500° C. or higher, which can be used in high-power, high-temperature and high-pressure environments, it is possible to manufacture such a supporting substrate without worrying about current leakage through the substrate (e.g., silicon substrate) due to parasitic capacitance occurred between the substrate and the insert 33, supposing that the insert 33 serves as an electrical pass. For reference, it is known that the melting point of silicon is 1414° C., $Al_2O_3$ 2040° C., AlN 2200° C., SiC 2500° C., and $Si_3N_4$ 1900° C.

As yet another alternative, the rod-shaped inserts 33 and the fixation substance 34 can be mixed together and coated on the first substrate 10, and a magnet is used to draw the inserts 33 into their corresponding grooves 14 such that the inserts 33 may be kept from being detached from the first plane 11 and the grooves 14. For instance, this is useful for preventing the detachment of the inserts 33 from the first plane 11 or from the grooves 14 due to a spinning motion as the fixation substance 34 is coated by spin coating after the inserts 33 are placed in their corresponding grooves 14.

FIG. 4 shows an example of a semiconductor device. In particular, a semiconductor light emitting chip 20 (e.g., a flip chip) and an encapsulating material 27 are provided on the first substrate 10. Once the semiconductor light emitting chip 20 is securely placed on the first substrate 10, the first substrate 10 is cut in such a way that each cut section includes a semiconductor light emitting chip 20. Preferably, a laser beam 28 is irradiated into the first substrate 10 to create cracks 29, and the first substrate 10 is then cut by a breaking process. In this manner, the first substrate 10 can be cut with less mechanical, chemical and/or thermal damage on the semiconductor light emitting chip 20 and the encapsulating material 27. Other components illustrated in the drawing include a growth substrate 21, a first semiconductor layer 22 having a first conductivity, an active layer 23 for generating light by recombination of electrons and holes, a second semiconductor layer 24 having a second conductivity different from the first conductivity, a pad 16, a pad 19, and a first electrode 25. The semiconductor light emitting chip 20 includes the first semiconductor layer 22, the active layer 23, the second semiconductor layer 24 and the first electrode 25 for supplying current that are sequentially grown on the growth substrate 21.

FIG. 5 shows another example of a semiconductor light emitting device. A vertical chip using a growth substrate 21a is mounted on the first substrate 10. A second electrode 26 is electrically connected to a second semiconductor layer 23, and to a pad 19-1 and an insert 15-1 through wires. A first semiconductor layer 22 is electrically connected to a pad 19-2 and an insert 15-2 through the growth substrate 21a. Another electrode can be present under the growth substrate 21a, and the growth substrate 21a and the vertical chip can be secured by one of conventional schemes known in the art. Other components with reference numerals that are already described above will not be discussed here again. In addition, if desirable for processing, the second substrate 17 can be provided on the pad 16 of the first substrate 10, using the bonding layer 18. Alternatively, the second substrate 17 can be provided on the pad 19 of the first substrate 10.

Referring next to FIG. 6, a lateral chip using the growth substrate 21a is mounted on the first substrate 10. The first electrode 25 is electrically connected to the first semiconductor layer 22, and the second electrode 26 is electrically connected to the second semiconductor layer 23. The first electrode 25 is electrically connected to the pad 19-2 and the insert 15-2 through wires, and the second electrode 26 is electrically connected to the pad 19-1 and the insert 15-1 through wires. Preferably, a pad 19-3 and an insert 15-3 are additionally provided and serve as a heat-dissipation pass from the semiconductor chip. If the growth substrate 21a is conductive, a separate insulation layer can be present between the pad 19-3 and the growth substrate 21a, or alternatively, the pad 19-3 may be replaced with a non-conductive material.

As discussed above, instead of using pastes or electroplating, the techniques described in FIGS. 2-6 use wires, rods, continuous liquid-phase substances or metal/alloy powders and organic binders to form the conductive parts 15, and the resulting inserts 33 are compactly formed in trenches, respectively, i.e. the grooves 14 with the bottom ends blocked.

SUMMARY

To address the issues of the conductive parts 15 shown in FIG. 1, the present disclosure provides a supporting substrate for a semiconductor light emitting device that does not have trench-like grooves 14 with the bottom ends blocked, and a method for manufacturing the supporting substrate.

This section provides a general summary of the disclosure and is not a comprehensive disclosure of its full scope or all of its features.

According to one aspect of the present disclosure, there is provided a method for manufacturing a supporting substrate for a semiconductor light emitting device, the method comprising: preparing a substrate having a groove; introducing a material into the groove of the substrate, the material serving to form a thermal and/or electrical pass; and compressing the material inwards from both ends of the groove, using a compressing means.

According to another aspect of the present disclosure, there is provided a method for manufacturing a supporting substrate for a semiconductor light emitting device, comprising: preparing a substrate having a groove; introducing a material into the groove of the substrate, the material serving to form a thermal and/or electrical pass arranged on an auxiliary substrate provided with a sacrificial layer; and separating, from the substrate, the auxiliary substrate with respect to the sacrificial layer.

The effect of the present disclose will be described in the last part of the description of example embodiments.

DETAILED DESCRIPTION

The present disclosure will now be described in detail with reference to the accompanying drawing(s).

Figure 7:
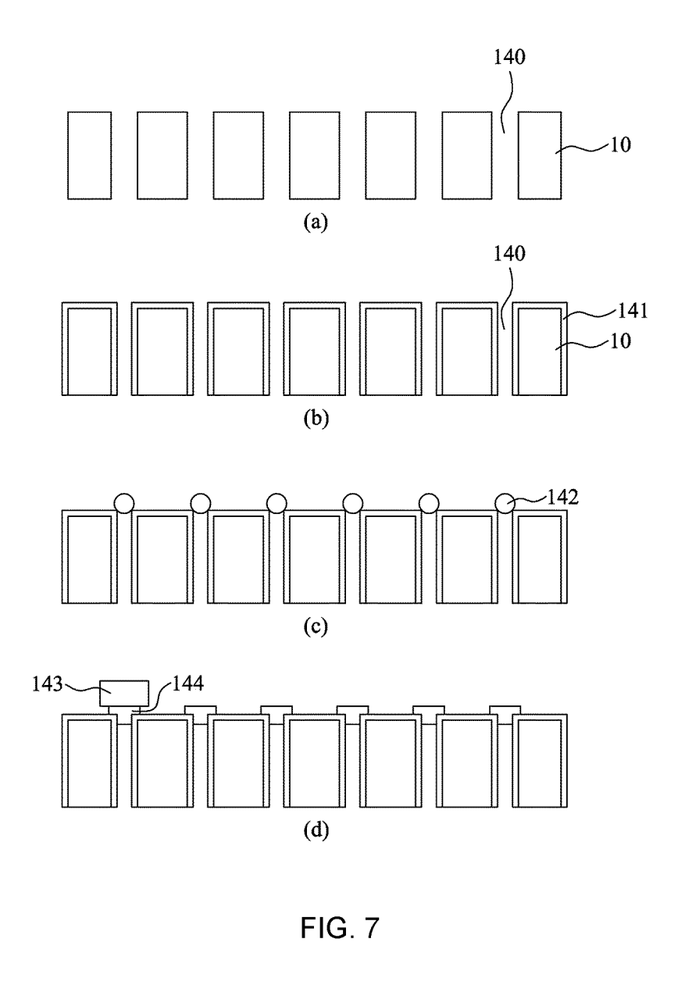
FIGS. 7 and 8 illustrate a method for manufacturing a supporting substrate for a semiconductor light emitting device according to an exemplary embodiment of the present disclosure.
Figure 8:
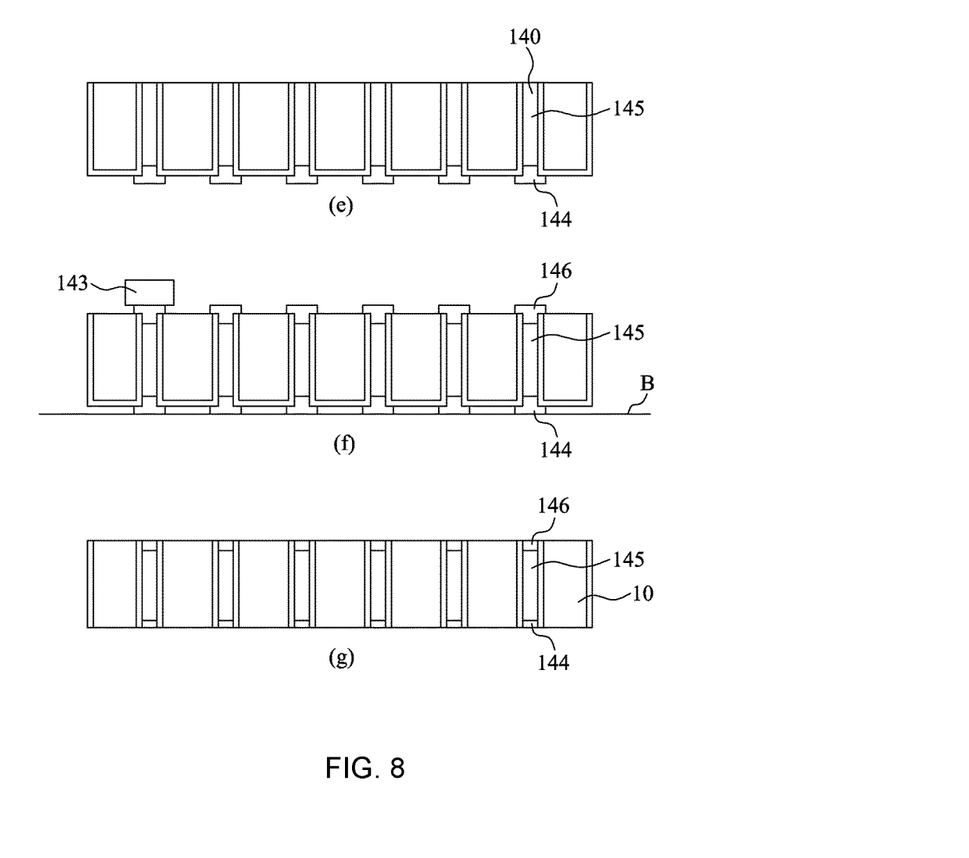

FIGS. 7 and 8 illustrate a method for manufacturing a supporting substrate for a semiconductor light emitting device according to an exemplary embodiment of the present disclosure.

Referring to FIG. 7A, first of all, a substrate 10 is prepared, and through holes 140 are formed in the substrate 10. The substrate 10 may be made of an $Al_2O_3$ single crystal (sapphire), an AlN sintered body, an $Al_2O_3$ sintered body, $SiN_x$, or the like, and is preferably made of a material that has a coefficient of thermal expansion comparable to that of the growth substrate 21 (see FIG. 4). The through holes 140 can be formed by punching, laser ablation, sand blasting, or the like. For example, the substrate 10 may have a thickness of 200-800 μm, preferably about 350 μm. The shape and width of the through holes 140 are not particularly limited. In case that the through holes 140 are circular, the diameter may be 50-200 μm, preferably 140 μm.

Turning now to FIG. 7B, a metal layer 141 is preferably formed on the upper face of the substrate 10, and within the through holes 140. The metal layer 141 is made of Ti, Cr, Ni, Au, Ag, Cu or the like, and serves to enhance adhesion and to form an electrical pass. The metal layer 141 may be formed by sputtering or E-beam deposition, for example.

The metal layer 141 serves to enhance adhesion of conductive balls 142 (to be described later), as well as to promote workability of the compressed conductive balls 144.

As shown in FIG. 7C, the conductive balls 142 are placed in the through holes 140. The conductive balls 142 may be made of a metal, such as Au, Ag, or Cu, and may be formed by wire bonding.

Continuing to FIG. 7D, the conductive balls 140 are compressed into the through holes 140 using a compressing means 143 (e.g., polished Si wafers), such that compressed conductive balls 144 are obtained. This operation is called 'coining', as published in Room-Temperature Wafer-Level Vacuum Sealing by Compression of High-Speed Wire Bonded Gold Bumps; M. Antelius, AC Fischer, N. Roxhed, G. Stemme and F. Niklaus; KTH Royal Institute of Technology, Stockholm, SWEDEN; https://wwwresearchgate-net/publication/252024013.

Referring next to FIG. 8E, one end of each through hole 140 is blocked by the corresponding compressed conductive ball 144, and conductive particles 145 are then introduced and filled in the through holes 140, respectively. Within the through holes 140, the conductive particles 145 serve as a thermal and/or electrical pass for the substrate 10 made of a non-conductive material. The conductive particles 145 may be a solder, paste or sinter (i.e. nearly organic substance-free sinter, unlike the solder or paste), primarily containing Ag, Cu, and Sn. Although the size of the conductive particles 145 may vary depending on the dimensions of the through holes 140, nano-scale particles may be employed. The conductive particles 145 may be introduced into the through holes 140 using a dispenser, a screen printer, or the like. For example, the conductive particles 145 are preferably 10 nm-10 μm, and more preferably about 1 μm. Preferably, once the conductive particles 145 are inserted in the through holes 145, heat is applied to make them compact.

Referring to FIG. 8F, while the substrate 10 is positioned on the bottom B, the conductive balls 146 are pressed by the compressing means 143 down to the other end of the through holes 140 during the processes in FIGS. 7C-7D. As such, the conductive particles 145 are pressed to form a compact thermal and/or electrical pass. In general, the conductive balls 146 may be compressed at room temperature or under heating, for example, between 200° C. and 0.67 $T_m$ (melting point) (i.e. a recrystallization temperature of the material of the conductive balls 144 and 146).

Lastly, referring to FIG. 8G, both sides of the substrate 10 are polished. Additionally or alternatively, the compressed conductive balls 144 and 146 stuck out of the through holes 140 and the metal layer 141 on the upper side of the substrate 10 are removed, such that the compressed conductive balls 144 and 146 are kept or confined within the through holes 140 from both ends thereof. If desirable, as shown in FIG. 2, the pads 16 and 19 may be provided onto the compressed conductive balls 144 and 146. Alternatively, the compressed conductive balls 144 and 146 may be used as the pads 16 and 19.

This configuration (the through holes 140—the metal layer 141—the compressed conductive balls 144 and 146—the conductive particles 145) allows a more reliable thermal and/or electrical pass by pressing the conductive particles 145 with the conductive balls 144 and 146.

Figure 9:
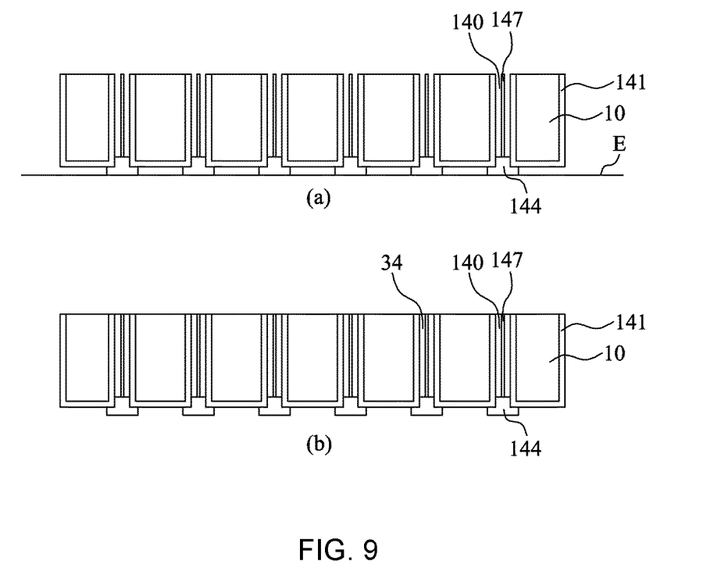
FIG. 9 illustrates a method for manufacturing a supporting substrate for a semiconductor light emitting device according to another exemplary embodiment of the present disclosure.

FIG. 9 illustrates a method for manufacturing a supporting substrate for a semiconductor light emitting device according to another exemplary embodiment of the present disclosure. Here, electroplated pillars 147 are used in replacement of the conductive particles 145 in the method of FIGS. 7-8.

Referring to FIG. 9A, after the substrate 10 is prepared by the processes in FIGS. 7A-7D, the electroplated pillars 147 are formed in their corresponding through holes 140. The compressed conductive balls 144 serve as an electrode E for electroplating. As shown, the compressed conductive balls 144 are advantageously used as electrodes when electroplating is carried out on the through holes 140. Here, electroplated pillars or rods 147 can be obtained by electroplating the conductive balls 144 in the form of a rod, rather than electroplating the compressed conductive balls 144 and then filling the entire through holes 140 with them. The through holes 140 are still filled up. Although the electroplated pillars 147 are primarily made of Cu, other materials are also acceptable as far as they can be plated. In particular, the metal layer 141 has a key role in obtaining electroplated pillars or rods 147 of uniform size and shape within the through holes 140 by electrically connecting those compressed conductive balls 144 that serve as electrodes E for electroplating.

Referring next to FIG. 9B, the fixation substance 34 is filled between the through hole 140 and the electroplated pillar 147. The fixation substance 34 may be formed by spin coating, including but not limited to spin-on-glass (SOG), benzocyclobutene (BCB), or the like.

Subsequent processes are the same as those shown in FIGS. 8F-8G.

This configuration (the through holes 140—the metal layer 141—the compressed conductive balls 144 and 146—the electroplated pillars 147—the fixation substance 34) facilitates the electroplating process because the fixation substance 34 is provided after electroplating which is carried out while the conductive balls 144 are already compressed and inserted into the through holes 140. In addition, as the electroplated pillars 147 take the form of rod or pillar, the electroplating process can be done without being obstructed by the walls of the through holes 140.

Figure 10:
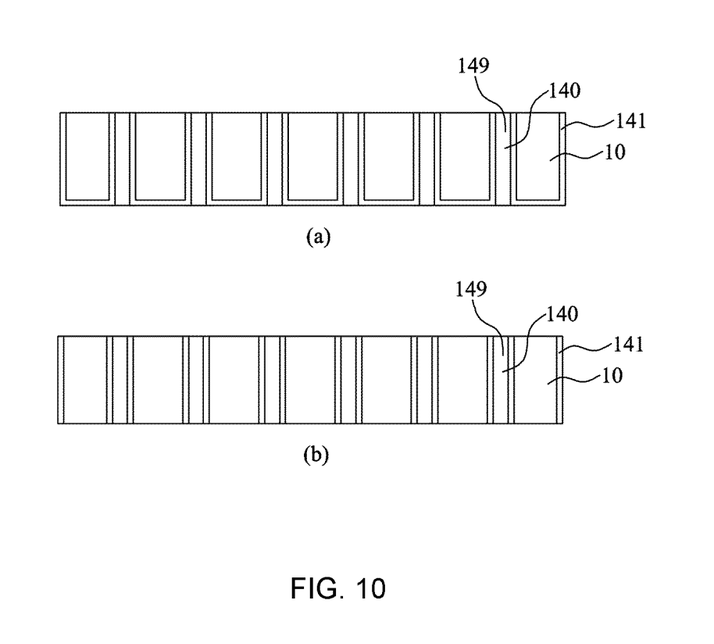
FIG. 10 illustrates a method for manufacturing a supporting substrate for a semiconductor light emitting device according to another exemplary embodiment of the present disclosure.

FIG. 10 illustrates a method for manufacturing a supporting substrate for a semiconductor light emitting device according to another exemplary embodiment of the present disclosure.

Referring to FIG. 10A, following the processes described FIGS. 7A-7B, a metal powder 149 (e.g., Cu powder) is compressed and inserted into the respective through holes 140. This is carried out without the help of the compressed conductive balls 144 and 146, which is different from those methods in FIGS. 7-9. A device like a screen printer or a diaphragm that applies vibration pressure to the substrate 10 may be utilized in order to compress the metal powder 149 inwards from both ends of the through hole 140 and insert it into the through hole 140. Preferably, the metal layer 141 is formed in the through hole 140. In case that the metal powder 140 is composed of Cu, it may have a size of, for example, 10 nm-110 μm, and preferably about 1 μm.

Referring next to FIG. 10B, sintering is carried out at a high temperature (e.g., 800° C. under $N_2$ and Ar atmosphere). Preferably, the metal layer 141 is removed during polishing.

If desirable, the compressed conductive balls 144 and 146 as shown in FIGS. 7-9 are obtained before or after the process shown in FIG. 10A, or after the process shown in FIG. 10B. Additionally or alternatively, polishing may be carried out.

This configuration (the through holes 140—the metal layer 141—the metal powder 149 that is compressed inwards from both ends of the through hole 140 and then sintered) allows a reliable thermal or electrical pass in the through holes 140, in absence of the electroplating process.

Figure 11:
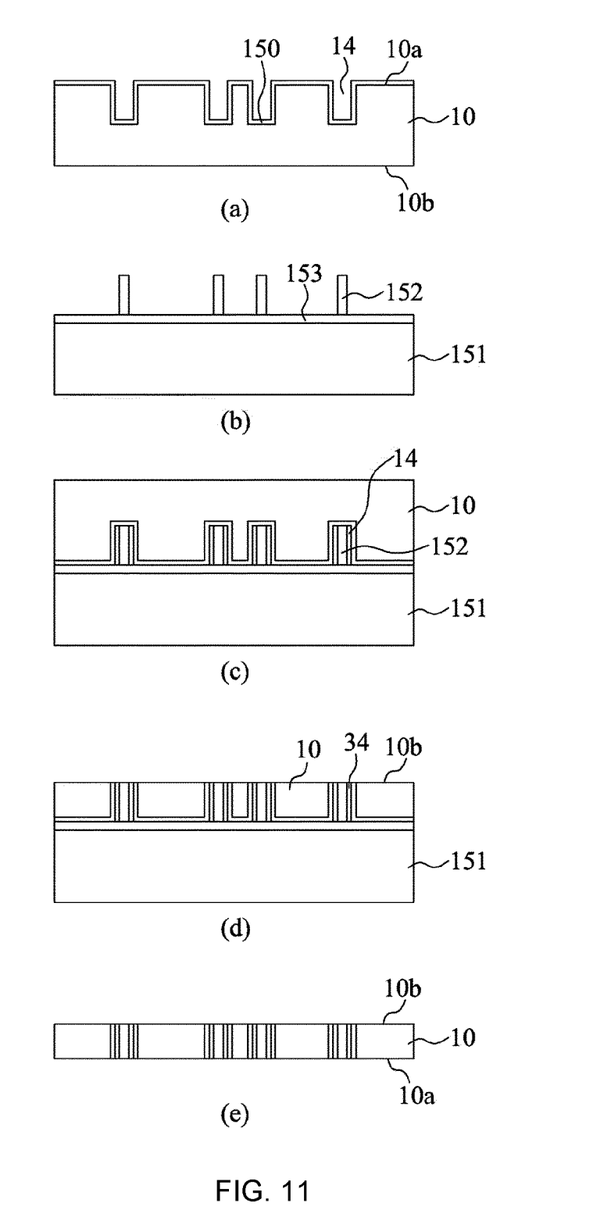
FIG. 11 illustrates a method for manufacturing a supporting substrate for a semiconductor light emitting device according to another exemplary embodiment of the present disclosure.

FIG. 11 illustrates a method for manufacturing a supporting substrate for a semiconductor light emitting device according to another exemplary embodiment of the present disclosure. This method differs from those shown in FIGS. 7-10 in that it uses an auxiliary substrate 151.

First, referring to FIG. 11A, the substrate 10 is prepared, trenches 14 are formed in the substrate 10, and a bonding material 150 is provided in each trench 14.

Separately, referring to FIG. 11B, an auxiliary substrate 151 is prepared. Conductive rods or pillars 152 are formed on the auxiliary substrate 151. The auxiliary substrate 151 may be made of sapphire. The type of material for the auxiliary substrate is not particularly limited, provided that the substrate transmits light. The conductive pillars 152 can be obtained by electrolytic or electroless plating, and made of a single metal (e.g., Cu) or a multi-layer structure (e.g., Cr/Au/Cu). For instance, the front side of the auxiliary substrate 151 is plated, and then the conductive pillars 152 are formed by etching. Alternatively, a mask is formed on the auxiliary substrate 151, and then the conductive pillars 152 are formed by plating. In addition, a sacrificial layer 153 may be formed on the auxiliary substrate 151 before the conductive pillars 152 are formed. As will be described later, the sacrificial layer 153 is used to remove the auxiliary substrate 151. If the sacrificial substrate 151 is to be removed by a laser lift-off (LLO) technique, the sacrificial layer 153 may be composed of Group III nitrides (e.g., InN, InGaN, GaN, or AlGaN), Group II oxides (e.g., ZnO), oxides ($SiO_2$, ITO, PZT, or $SnO_2$), or organic materials (e.g., polymers) that cause decomposition by reacting with a laser light source having a specific wavelength (energy). For instance, the sacrificial layer 153 may have one of the following structures: the auxiliary substrate 151 (sapphire)/$ITO/SiO_2$, the auxiliary substrate 151 (sapphire)/GaN, the auxiliary substrate 151 (sapphire)/ZnO, the auxiliary substrate 151 (sapphire)/InGaN/ZnO. Preferably, the trenches 14 may have a depth of at least 100 μm and a width or diameter of at least 50 μm. When the conductive pillars 152 are made of Cu, their height and width are preferably 10% lower than the height and width of the trenches 14, taking the subsequent bonding process (i.e. wafer bonding) into consideration. As the formation of the conductive pillars 152 is done without being obstructed by the trenches 14 or through holes 140 (see FIGS. 7-10), it is more reliable in obtaining the conductive pillars 152 which serve as a thermal and/or electrical pass. In this regard, those through holes 140 illustrated in FIGS. 7-10 can be used in place of the trenches 14. Alternatively, when the trenches 14 are available, the conductive pillars 152, together with the trenches 14, may contribute to a higher reliability of a thermal and/or electrical pass formed of the conductive pillars 152 as compressed by the auxiliary substrate 151.

Turning now to FIG. 11C, the substrate 10 and the auxiliary 151 are coupled together, which may be achieved by wafer bonding. Examples of material used for wafer bonding may include, but are not limited to, Ni—Sn, Au—Sn, Cu—Cu, Au—Au, or the like. If the bonding material 150 is provided in each trench 14, it can also be provided onto the front side 10*a* of the substrate 10. In other words, the bonding material 150 can be composed of a material such as Ni—Sn, Au—Sn, Cu—Cu, Au—Au, or the like. In this process, the conductive pillars 152 are aligned with the trenches 14 and inserted therein. With the bonding material 150, the conductive pillars 152 and the trenches 14 are adhered together.

Next, referring to FIG. 11D, the rear side 10*b* of the substrate 10 is preferably polished. Here, the auxiliary substrate 151 may protect the substrate 10 from being broken during the polishing process. Once polished, as shown in FIG. 9B, the open trenches 14 receive the fixation substance 34. If the through holes 140 were used from the beginning, the polishing process could be omitted. The substrate 10 having trenches 14 can be relatively thicker than the substrate 10 having grooves 150, such that the substrate 10 is retained stably during the manufacturing process including providing the conductive pillars 152. Additionally or alternatively, the substrate 10 may have through holes 140 of a sufficient depth and may be polished.

Lastly, the auxiliary substrate 151 is removed. It can be removed by a laser lift-off (LLO) technique. The front side 10a of the substrate 10 free of the auxiliary substrate 151 is then polished.

In this configuration (the trenches 14/the through holes 140—the bonding material 150—the fixation substance 34—the conductive pillars 152), the conductive pillars 152 are formed on the auxiliary substrate 151 and then grafted into the trenches 14/the through holes 140 in the substrate 10, such that a highly reliable thermal and/or electrical pass can be formed without being obstructed by the trenches 14/the through holes 140.

As an alternative to the formation of the fixation substance 34 by spin coating, the compressed conductive balls 144 described in FIGS. 7-8 may be used, or an electroplating process described in FIG. 9 may be incorporated as well.

Figure 12:
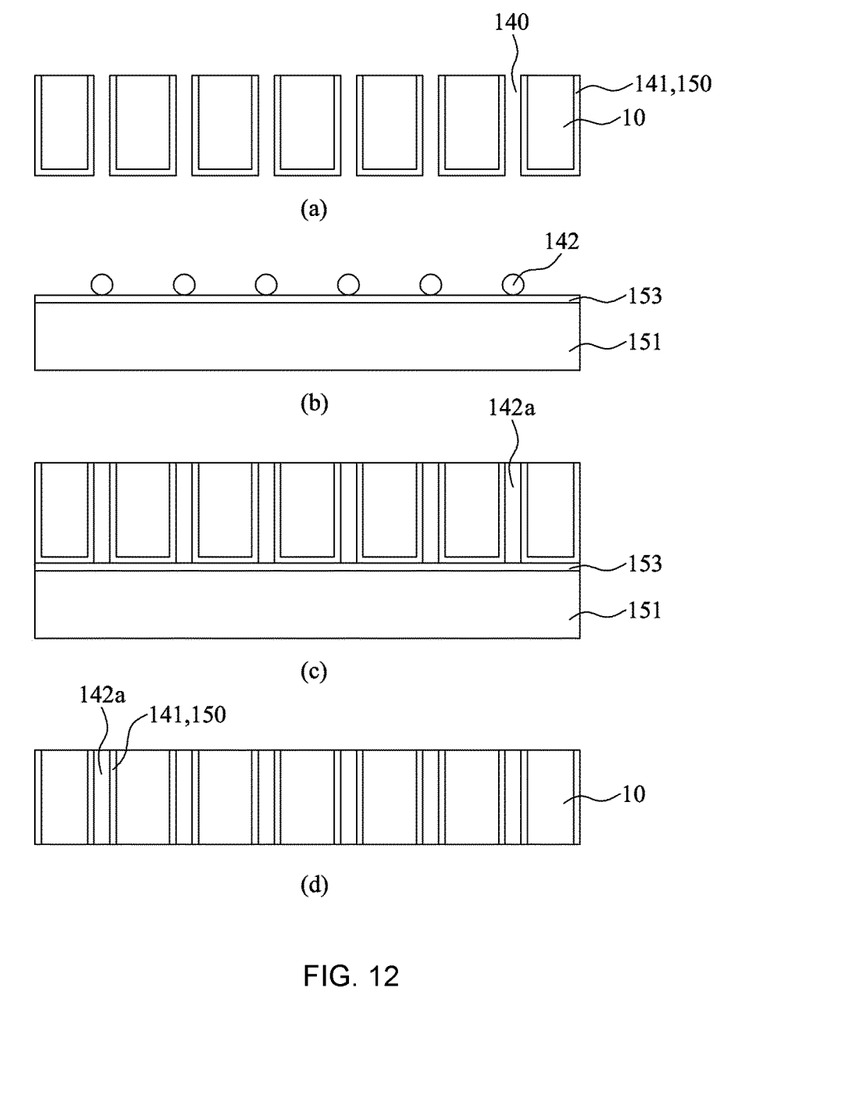
FIG. 12 illustrates a method for manufacturing a supporting substrate for a semiconductor light emitting device according to another exemplary embodiment of the present disclosure.

FIG. 12 illustrates a method for manufacturing a supporting substrate for a semiconductor light emitting device according to another exemplary embodiment of the present disclosure.

Referring to FIG. 12A, the substrate 10 shown in FIG. 7B is first prepared. The metal layer 141 or the bonding material 150 is provided in the through holes 140. When the bonding material 150 is a metal, it may also be regarded as a type of the metal layer 141. If the metal layer 141 includes an adhesive metal, it may be referred to as a bonding material 150.

Turning now to FIG. 12B, the sacrificial layer 153 is provided on the auxiliary substrate 151, and the conductive balls 142 shown in FIG. 7C are formed on the auxiliary substrate 151.

Next, as shown in FIG. 12C, the substrate 10 and the auxiliary substrate 151 are compressed together. Here, the conductive balls 142 are preferably heated beforehand, and the resulting fluidic conductive balls can smoothly flow in the through holes 140. In this way, a conductive pass 142 in which the conductive balls 142 are press-fitted is obtained.

Lastly, referring to FIG. 12D, the processes described in FIGS. 11D-11E are carried out, so that the auxiliary substrate 151 is separated and the substrate 10 is polished.

Hereinafter, a variety of examples of the present disclose will be explained.

(1) A method for manufacturing a supporting substrate for a semiconductor light emitting device, comprising: preparing a substrate having a groove; introducing a material into the groove of the substrate, the material serving to form a thermal and/or electrical pass; and compressing the material inwards from both ends of the groove, using a compressing means.

(2) The groove is a through hole.

(3) The groove is a trench, the trench having one end blocked.

(4) During compressing, a compressed conductive ball is used.

(5) During introducing the material, an electroplated pillar forms the thermal and/or electrical pass.

(6) After introducing the material, forming a fixation substance between the groove and the electroplated pillar.

(7) During compressing, metal powders are compressed inwards from both ends of the through hole.

(8) During compressing, an auxiliary substrate is used.

(9) A sacrificial layer is formed on the auxiliary substrate.

(10) A bonding material is provided on a front side of the substrate.

(11) A method for manufacturing a supporting substrate for a semiconductor light emitting device, comprising: preparing a substrate having a groove; introducing a material into the groove of the substrate, the material serving to form a thermal and/or electrical pass arranged on an auxiliary substrate provided with a sacrificial layer; and separating, from the substrate, the auxiliary substrate with respect to the sacrificial layer.

(12) The material is a conductive pillar.

(13) The material is a conductive ball.

As described above, the supporting substrate for a semiconductor light emitting device according to the present disclosure can resolve the issues of the conductive part 15 in FIG. 1, without incorporating trench-like grooves 14, each having one end blocked.

In addition, the supporting substrate for a semiconductor light emitting device according to the present disclosure can resolve the issues of the conductive part 15 in FIG. 1, with incorporating trench-like grooves 14, each having one end blocked.

What is claimed is:

1. A method for manufacturing a supporting substrate for a semiconductor light emitting device, comprising:
   preparing a substrate having a groove;
   forming a metal layer on an upper side of the substrate and only within the groove to enhance adhesion and to form an electrical pass;
   introducing a material into the groove of the substrate where the metal layer is formed inside, the material serving to form a thermal and/or electrical pass;
   compressing the material inwards from both ends of the groove, using a compressing means; and
   polishing both sides of the substrate to remove a portion of the material stuck out of the groove and the metal layer on the upper side of the substrate,
   wherein the material and the metal layer are kept or confined within both ends of the groove, and
   wherein both ends of the material and the metal layer are directly exposed to the outside to form the thermal and/or electrical pass inside the substrate.

2. The method of claim 1, wherein the groove is a through hole.

3. The method of claim 2, wherein, during compressing, a compressed conductive ball is used.

4. The method of claim 2, wherein, during introducing the material, an electroplated pillar forms the thermal and/or electrical pass.

5. The method of claim 4, further comprising:
   after introducing the material, forming a fixation substance between the groove and the electroplated pillar.

6. The method of claim 2, wherein, during compressing, metal powders are compressed inwards from both ends of the through hole.

7. The method of claim 1, wherein the groove is a trench, and the trench has one end blocked.

8. The method of claim 7, wherein, during compressing, an auxiliary substrate is used.

9. The method of claim 8, wherein a sacrificial layer is formed on the auxiliary substrate.

10. The method of claim 8, wherein a bonding material is provided on a front side of the substrate.

11. A method for manufacturing a supporting substrate for a semiconductor light emitting device, comprising:
- preparing a substrate having a groove;
- forming a metal layer on an upper side of the substrate and only within the groove to enhance adhesion and to form an electrical pass;
- introducing a material into the groove of the substrate where the metal layer is formed inside, the material serving to form a thermal and/or electrical pass arranged on an auxiliary substrate provided with a sacrificial layer;
- separating, from the substrate, the auxiliary substrate with respect to the sacrificial layer; and
- polishing both sides of the substrate to remove a portion of the material stuck out of the groove and the metal layer on the upper side of the substrate,
- wherein the material and the metal layer are kept or confined within both ends of the groove, and
- wherein both ends of the material and the metal layer are directly exposed to the outside to form the thermal and/or electrical pass inside the substrate.

12. The method of claim 11, wherein the material is a conductive pillar.

13. The method of claim 11, wherein the material is a conductive ball.

* * * * *